US007344960B2

(12) United States Patent
Watanabe

(10) Patent No.: US 7,344,960 B2
(45) Date of Patent: Mar. 18, 2008

(54) SEPARATION METHOD FOR CUTTING SEMICONDUCTOR PACKAGE ASSEMBLAGE FOR SEPARATION INTO SEMICONDUCTOR PACKAGES

(75) Inventor: Takashi Watanabe, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 11/723,639

(22) Filed: Mar. 21, 2007

(65) Prior Publication Data

US 2007/0224781 A1 Sep. 27, 2007

(30) Foreign Application Priority Data

Mar. 24, 2006 (JP) ............................ 2006-083737

(51) Int. Cl.

*H01L 21/46* (2006.01)
*H01L 21/78* (2006.01)
*H01L 21/301* (2006.01)
*H01L 21/50* (2006.01)
*H01L 21/48* (2006.01)
*H01L 23/544* (2006.01)
*H01L 21/768* (2006.01)

(52) U.S. Cl. ...................... 438/462; 438/458; 438/113; 257/620; 257/E21.596; 257/E21.599

(58) Field of Classification Search ................ 438/113, 438/462, 458; 257/620, E21.596, E21.599
See application file for complete search history.

(56) References Cited

U.S. PATENT DOCUMENTS 6,489,218 B1 * 12/2002 Kim et al. .................. 438/460
6,841,414 B1 * 1/2005 Hu et al. .................... 438/106
7,056,768 B2 6/2006 Kameyama et al.

FOREIGN PATENT DOCUMENTS

JP 2005-39088 2/2005

* cited by examiner

*Primary Examiner*—Luan Thai
(74) *Attorney, Agent, or Firm*—Smith, Gambrell & Russell, LLP

(57) ABSTRACT

A separation method by which a semiconductor package assemblage is cut in a predetermined width W1 along streets arranged in a lattice pattern to separate the semiconductor package assemblage into a plurality of semiconductor packages, the semiconductor package assemblage including a metallic frame having metallic die pads of a predetermined thickness placed in a plurality of rectangular regions defined by the streets, and metallic electrodes of a predetermined thickness placed in the streets and extending in the width direction of the streets, one surface of each die pad and one surface of each electrode being exposed on one surface of the semiconductor package assemblage, whereby each electrode has an intermediate portion in the extending direction removed, and has opposite end portions annexed to the adjacent semiconductor packages. The separation method comprises: a pre-cutting step of forming grooves in the one surface of the semiconductor package assemblage by a rotary cutting blade, each groove having a width W3 in each of opposite side edges of a region having a width W2 larger than the predetermined width W1 in the street, where (W2−2×W3)<W1, and each groove having a depth D larger than the thickness of the electrode; and a main cutting step of cutting the semiconductor package assemblage in the predetermined width W1 along the streets by a rotary cutting blade having a thickness corresponding to the predetermined width W1.

4 Claims, 2 Drawing Sheets

SEPARATION METHOD FOR CUTTING SEMICONDUCTOR PACKAGE ASSEMBLAGE FOR SEPARATION INTO SEMICONDUCTOR PACKAGES

FIELD OF THE INVENTION

This invention relates to a separation method for cutting a semiconductor package assemblage to separate it into a plurality of semiconductor packages. More specifically, the invention relates to a separation method comprising cutting a semiconductor package assemblage in a predetermined width along streets arranged in a lattice pattern to separate the semiconductor package assemblage into a plurality of semiconductor packages, the semiconductor package assemblage comprising metallic die pads of a predetermined thickness placed in a plurality of rectangular regions defined by the streets, and metallic electrodes of a predetermined thickness placed in the streets and extending in the width direction of the streets, the metallic die pads and the metallic electrodes being exposed on one surface of the semiconductor package assemblage, whereby each of the electrodes has an intermediate portion in the extending direction removed, and has opposite end portions annexed to the adjacent semiconductor packages.

DESCRIPTION OF THE PRIOR ART

As is well known among people skilled in the art, it is common practice in the production of a semiconductor package to form a semiconductor package assemblage, and cut the semiconductor package assemblage as required to separate it into a plurality of semiconductor packages. A typical example of the semiconductor package assemblage includes a metallic frame, a plurality of semiconductor chips, and an encapsulation resin. The metallic frame includes die pads disposed in a plurality of rectangular regions defined by streets arranged in a lattice pattern, and electrodes placed in the streets and extending in the width direction of the streets. The semiconductor chip is disposed in each of the die pads, and the encapsulation resin encapsulates all of the semiconductor chips. On one surface of the semiconductor package assemblage, one surface of each die pad and one surface of each electrode are exposed. The semiconductor package assemblage is cut in a predetermined width along the streets, and thereby separated into a plurality of semiconductor packages. Such cutting of the semiconductor package assemblage is performed by a rotary cutting blade of a thickness corresponding to the predetermined width. The rotary cutting blade, which is advantageously used, is one comprising diamond grains bound by an electroformed metal. In cutting the semiconductor package assemblage in the predetermined width along the streets, each electrode extending in the width direction of the street has an intermediate portion in the extending direction removed, and has opposite end portions annexed to the adjacent semiconductor packages.

The above-described separation method for a semiconductor package assemblage, however, poses the following problems to be solved: When the encapsulation resin and the electrode are cut with the rotary cutting blade having the thickness corresponding to the predetermined width, so-called burrs tend to be formed at the cut edge of the electrode, because the electrode formed from the metal has ductility. If the burrs are present in the electrode of the semiconductor package separated individually, the unallowable event that the adjacent electrodes short-circuit may happen. The presence of the burrs may also often disadvantage the mounting of the semiconductor package.

In order to solve the above-mentioned problems due to burrs, JP 2005-39088A discloses that after a semiconductor package assemblage is cut along streets by a rotary cutting blade, the cut surface is traced with a deburring rotary blade to remove burrs. To remove the burrs by the deburring rotary blade, however, there is need to trace the cut surface at a considerably low speed, thereby markedly decreasing the efficiency of producing a semiconductor package.

SUMMARY OF THE INVENTION

It is a principal object of the present invention, therefore, to provide a novel and improved separation method which can cut a semiconductor package assemblage in a predetermined width along streets to separate it into individual semiconductor packages, without substantially generating burrs, with a decrease in the efficiency of semiconductor package production being sufficiently curtailed.

The inventor diligently conducted studies and experiments, and has noticed the fact that if, preferably, a sufficiently thin rotary cutting blade is used to cut a metal, the metal can be cut without substantial generation of burrs. Based on this fact, the inventor has found that the aforementioned principal object can be attained by performing the cutting step in two stages, namely, a first stage in which when an electrode is cut, cutting is performed at a relatively low speed with the use of a relatively thin rotary cutting blade, and a second stage in which after cutting of the electrode is completed, cutting is performed at a relatively high speed with the use of a rotary cutting blade having a thickness corresponding to a predetermined cutting width.

According to the present invention, as a separation method for attaining the above principal object, there is provided a separation method by which a semiconductor package assemblage is cut in a predetermined width W1 along streets arranged in a lattice pattern to separate the semiconductor package assemblage into a plurality of semiconductor packages, the semiconductor package assemblage being composed of a metallic frame having metallic die pads of a predetermined thickness placed in a plurality of rectangular regions defined by the streets, and metallic electrodes of a predetermined thickness placed in the streets and extending in the width direction of the streets, semiconductor chips disposed on the respective die pads, and an encapsulation resin for encapsulating the semiconductor chips, one surface of each of the die pads and one surface of each of the electrodes being exposed on one surface of the semiconductor package assemblage, whereby each of the electrodes has an intermediate portion in the extending direction thereof removed, and has opposite end portions annexed to the adjacent semiconductor packages, the separation method comprising:

a pre-cutting step of forming grooves in the one surface of the semiconductor package assemblage by a rotary cutting blade, each of the grooves having a width W3 in each of opposite side edges of a region having a width W2 larger than the predetermined width W1 in the street, where $(W2-2\times W3)<W1$, and each of the grooves having a depth D larger than the thickness of the electrode; and a main cutting step of cutting the semiconductor package assemblage in the predetermined width W1 between the grooves along the streets by a rotary cutting blade having a thickness corresponding to the predetermined width W1.

During the pre-cutting step, it is preferred that a pair of the grooves be formed with the use of a single rotary cutting tool having two of the rotary cutting blades disposed with a predetermined spacing, each of the rotary cutting blades having a thickness corresponding to the width W3. Preferably, the width W3 is smaller than the predetermined width W1 and, in particular, is smaller than a half of the predetermined width W1.

DETAILED DESCRIPTION OF THE PREFERRED EMBODIMENTS

Preferred embodiments of the separation method according to the present invention will be described in further detail by reference to the accompanying drawings.

Figure 1:
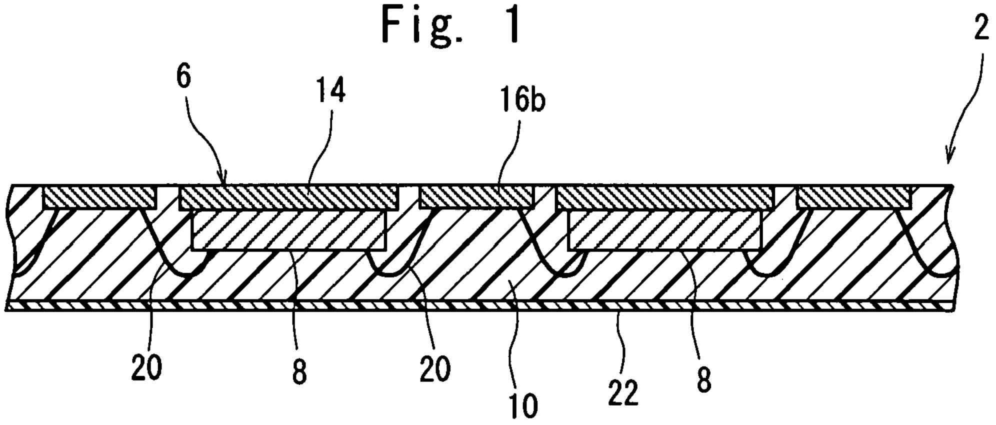
FIG. 1 is a sectional view taken along line I-I of FIG. 2, showing a typical example of a semiconductor package assemblage to which the separation method of the present invention is applied.
Figure 2:
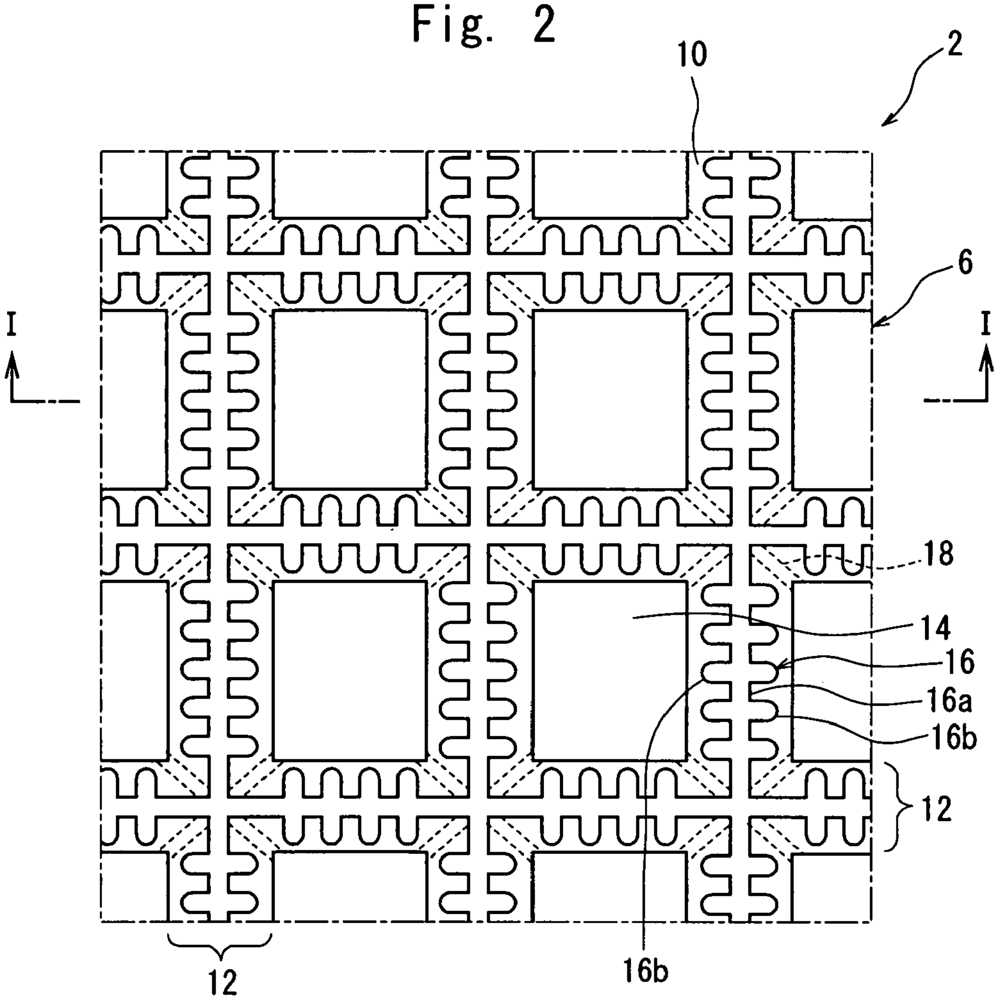
FIG. 2 is a plan view of the semiconductor package assemblage shown in FIG. 1.

FIGS. 1 and 2 show an example of a semiconductor package assemblage to which the separation method of the present invention is applied. A semiconductor package assemblage, indicated entirely at a numeral 2, is to be separated into semiconductor packages 4 (FIG. 5) of the type called QFN (quad flat non leaded package). The semiconductor package assemblage 2 includes a metallic frame 6, a plurality of semiconductor chips 8, and an encapsulation resin 10.

As shown clearly in FIG. 2, the metallic frame 6, which can be formed from a highly conductive metal such as copper, has die pads 14 placed in a plurality of rectangular regions defined by streets 12 arranged in a lattice pattern, electrodes 16 placed in the streets 12, and support bars 18 disposed at the intersections of the streets 12. The die pad 14 and the electrode 16 have the same thickness and one surface (upper surface in FIG. 1) of the die pad 14 and one surface (upper surface in FIG. 1) of the electrode 16 are exposed on one surface (upper surface in FIG. 1) of the semiconductor package assemblage 2. On the other hand, the support bar 18 is somewhat thinner than the die pad 14 and the electrode 16. In FIG. 1, the lower surface of the support bar 18 is coplanar with the lower surfaces of the die pad 14 and the electrode 16, while the upper surface of the support bar 18 is located somewhat below the upper surfaces of the die pad 14 and the electrode 16. Thus, not only the lower surface, but also the upper surface of the support bar 18 is covered with the encapsulation resin 10. The electrode 16 includes a connecting portion 16*a* extending slenderly along the street 12, and extending portions 16*b* extending from the connecting portion 16*a* toward the die pads 14 bilaterally in the width direction of the street 12. The support bar 18 extends diagonally at the intersection of the streets 12.

As understood from FIG. 1, the semiconductor chip 8 is mounted on the other surface (lower surface in FIG. 1) of each of the plurality of die pads 14 of the metallic frame 6. The semiconductor chip 8 and the extending portion 16*b* of the electrode 16 are electrically connected by a bonding wire 20.

The encapsulation resin 10, which is advantageously formed from a thermosetting rigid resin such as epoxy resin, silicone resin or polyimide resin, covers the semiconductor chips 8 and the bonding wires 20. On the one surface side (upper surface side in FIG. 1) of the semiconductor package assemblage 2, the encapsulation resin 10 is exposed in the regions in the streets where the electrodes 16 are not present.

In the illustrated semiconductor package assemblage 2, moreover, a support tape 22, which can be formed from a suitable resin film such as a polyethylene film, is stuck to the other surface (lower surface in FIG. 1) of the semiconductor package assemblage 2.

In the separation method of the present invention, it is important that a pre-cutting step and a main cutting step be performed sequentially.

Figure 3:
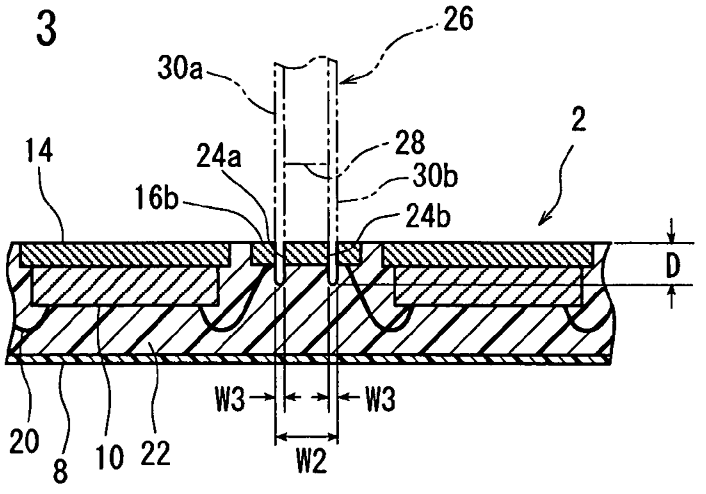
FIG. 3 is a sectional view for illustrating a pre-cutting step in a preferred embodiment of the separation method of the present invention.

By reference to FIG. 3, during the pre-cutting step, a pair of grooves 24*a* and 24*b* extending in opposite side edge portions of each of the streets 12 along each of the streets 12 are formed in the one surface of the semiconductor package assemblage 2. It is important that a width W2, which is defined by the outer side edge of the groove 24*a* and the outer side edge of the groove 24*b*, be smaller than the width of the street 12, but larger than a cutting width (to be described later), namely, a predetermined width W1. The width W3 of each of the grooves 24*a* and 24*b* importantly fulfills the condition $(W2-2\times W3)<W1$, and is preferably smaller than the predetermined width W1 and, in particular, is smaller than a half of the predetermined width W1. It is important that the depth D of each of the grooves 24*a* and 24*b* be somewhat larger than the thickness of the metallic frame 6. When the grooves 24*a* and 24*b* are formed, therefore, opposite end portions of the extending portion 16*b* of the electrode 16 disposed in each of the streets 12 are cut off from the other portion by the grooves 24*a* and 24*b*, and opposite end portions of the support bar 18 disposed at the intersection of the streets 12 are also cut off from the other portion by the grooves 24*a* and 24*b* (reference is requested to FIG. 2 along with FIG. 3).

With further reference to FIG. 3, the above pair of grooves 24*a* and 24*b* can be advantageously formed by a single rotary cutting tool 26. The rotary cutting tool 26 is equipped with two rotary cutting blades 30*a* and 30*b* coupled integrally, with a spacer 28 of a predetermined width being interposed between the rotary cutting blades 30*a* and 30*b*. Each of the rotary cutting blades 30*a* and 30*b* is advantageously formed by binding diamond grains by a suitable binding material such as an electroformed metal, and has a thickness corresponding to the width W3. The rotary cutting tool 26 is located at a height position illustrated in FIG. 3 with respect to the semiconductor package assemblage 2, and is relatively moved with respect to the semiconductor package assemblage 2 in a direction perpendicular to the sheet face of FIG. 3, while being rotated about its central axis, whereby the pair of grooves 24*a* and 24*b* can be formed simultaneously. The relative feed speed of the rotary cutting tool 26 with respect to the semiconductor package assemblage 2 is desired to be relatively low. According to the inventor's experience, if the thickness of each of the rotary cutting blades 30*a* and 30*b* is of the order of 30 to 100 μm, the relative feed speed of the rotary cutting tool 26 is of the order of 20 to 50 mm/minute, and the rotational speed of the rotary cutting tool 26 is of the order of 20,000 to 30,000 rpm, then the grooves 24*a* and 24*b* can be formed, without substantially causing burrs to the electrode 16 and the support bar 18 cut. In the illustrated embodiment, the pair of grooves 24*a* and 24*b* are simultaneously formed using the single rotary cutting tool 26 having the two rotary cutting blades 30*a* and 30*b*. If desired, however, the grooves 24*a* and 24*b* can be formed sequentially with the use of a rotary cutting tool having a single rotary cutting blade.

Figure 4:
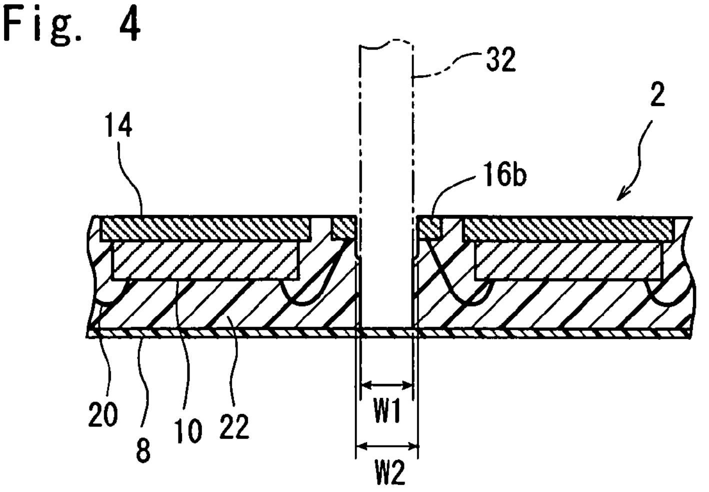
FIG. 4 is a sectional view for illustrating a main cutting step in the preferred embodiment of the separation method of the present invention.

With reference to FIG. 4, a main cutting step is performed after the above-described pre-cutting step. In this main cutting step, the semiconductor package assemblage 2 is cut along the street 12 between the pair of grooves 24*a* and 24*b* by means of a rotary cutting tool provided with a rotary cutting blade 32 having a thickness corresponding to the predetermined width W1, whereby the semiconductor package assemblage 2 is separated into the individual semiconductor packages 4. The rotary cutting blade 32, like the rotary cutting blades 30*a* and 30*b*, is advantageously formed by binding diamond grains by a suitable binding material such as an electroformed metal. In the main cutting step, neither the electrode 16 nor the support bar 18 is cut, so that no problem occurs even if the relative feed speed of the rotary cutting tool is set at a sufficiently high value. According to the present invention, therefore, the electrode 16 and the support bar 18 can be cut without generation of burrs, and the cutting of the semiconductor package assemblage 2 can be performed, with a decrease in the cutting efficiency being avoided as much as possible.

Figure 5:
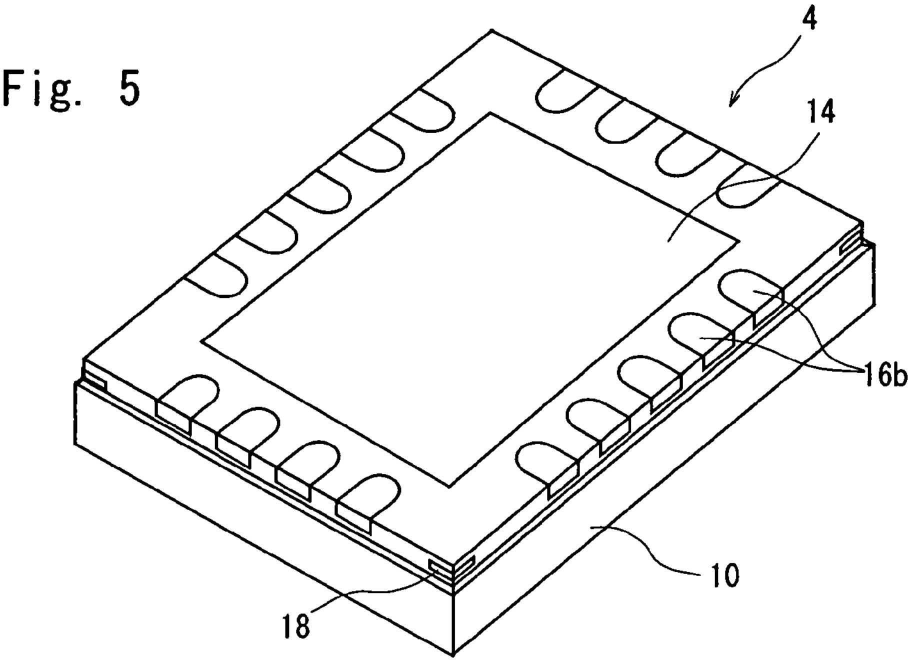
FIG. 5 is a perspective view showing a semiconductor package separated from the semiconductor package assemblage of FIG. 1.

Even in the main cutting step, the support tape 22 is not cut. Thus, the semiconductor packages 4 individually separated by the main cutting step continue to be integrally held by the support tape 22. In a pickup step well known per se, which is performed subsequently to the main cutting step, the individual semiconductor packages 4 are detached from the support tape 22, and mounted at required sites. FIG. 5 shows the single semiconductor package 4 detached from the support tape 22.

While the preferred embodiments of the separation method according to the present invention have been described in detail by reference to the accompanying drawings, it is to be understood that the invention is not limited to such embodiments, but various changes and modifications may be made without departing from the scope of the present invention.

What I claim is:

1. A separation method by which a semiconductor package assemblage is cut in a predetermined width W1 along streets arranged in a lattice pattern to separate the semiconductor package assemblage into a plurality of semiconductor packages, the semiconductor package assemblage being composed of a metallic frame having metallic die pads of a predetermined thickness placed in a plurality of rectangular regions defined by the streets, and metallic electrodes of a predetermined thickness placed in the streets and extending in a width direction of the streets, semiconductor chips disposed on the die pads, and an encapsulation resin for encapsulating the semiconductor chips, one surface of each of the die pads and one surface of each of the electrodes being exposed on one surface of the semiconductor package assemblage, whereby each of the electrodes has an intermediate portion in an extending direction thereof removed, and has opposite end portions annexed to the adjacent semiconductor packages, the separation method comprising:

a pre-cutting step of forming grooves in the one surface of the semiconductor package assemblage by a rotary cutting blade, each of the grooves having a width W3 in each of opposite side edges of a region having a width W2 larger than the predetermined width W1 in the street, where (W2−2×W3)<W1, and each of the grooves having a depth D larger than the thickness of the electrode; and a main cutting step of cutting the semiconductor package assemblage in the predetermined width W1 between the grooves along the streets by a rotary cutting blade having a thickness corresponding to the predetermined width W1.

2. The separation method according to claim 1, wherein during the pre-cutting step, a pair of the grooves are formed using a single rotary cutting tool having two of the rotary cutting blades disposed with a predetermined spacing, each of the rotary cutting blades having a thickness corresponding to the width. W3.

3. The separation method according to claim 1, wherein the width W3 is smaller than the predetermined width W1.

4. The separation method according to claim 3, wherein the width W3 is smaller than a half of the predetermined width W1.

* * * * *